United States Patent
Yokoyama et al.

(10) Patent No.: US 6,755,734 B2
(45) Date of Patent: Jun. 29, 2004

(54) FAN FILTER UNIT CONTROL SYSTEM AND CLEAN ROOM PROVIDED WITH SAME

(75) Inventors: Makoto Yokoyama, Tokyo (JP); Keiichi Ono, Tokyo (JP); Fumiyuki Tamura, Tokyo (JP)

(73) Assignee: Hitachi, Ltd. (JP)

( * ) Notice: Subject to any disclaimer, the term of this patent is extended or adjusted under 35 U.S.C. 154(b) by 0 days.

(21) Appl. No.: 10/267,449

(22) Filed: Oct. 8, 2002

(65) Prior Publication Data

US 2003/0040269 A1 Feb. 27, 2003

Related U.S. Application Data

(63) Continuation of application No. 10/028,149, filed on Dec. 20, 2001, now Pat. No. 6,607,435.

(30) Foreign Application Priority Data

Aug. 24, 2001 (JP) ........................................ 2001-253771

(51) Int. Cl.⁷ ................................................ B01L 1/04
(52) U.S. Cl. ...................................... 454/187; 55/385.2
(58) Field of Search ................................ 454/187, 184; 414/935

(56) References Cited

U.S. PATENT DOCUMENTS

| | | | | |
|---|---|---|---|---|
| 5,090,972 A | * | 2/1992 | Eller et al. ...................... 95/10 |
| 5,096,477 A | * | 3/1992 | Shinoda et al. ............. 55/385.2 |
| 5,180,331 A | * | 1/1993 | Daw et al. .................. 454/187 |
| 5,299,584 A | * | 4/1994 | Miyazaki et al. ......... 134/56 R |
| 5,415,585 A | * | 5/1995 | Miyagi ....................... 454/187 |
| 5,984,775 A | * | 11/1999 | Lee et al. .................... 454/187 |
| 6,098,023 A | * | 8/2000 | Hwang et al. ................ 702/45 |
| 6,151,903 A | * | 11/2000 | Hironaka ................... 62/176.6 |
| 6,230,080 B1 | * | 5/2001 | Lee et al. ................... 700/275 |
| 6,368,208 B1 | * | 4/2002 | Minoshima ................. 454/187 |

* cited by examiner

Primary Examiner—Derek S. Boles

(74) Attorney, Agent, or Firm—Townsend and Townsend and Crew LLP

(57) ABSTRACT

Information from fan filter units and differential pressure gauges provided in a ceiling of a clean room is used to control directions and volumes of air flows blown from respective fan filter units. In order to improve a wind velocity distribution in the clean room, pressure in a ceiling chamber is made uniform and control of the FFU revolution speeds of fan filter units is made easy. In order to control directions of air flows in the clean room, damper adjusting mechanisms are provided under a grating floor of the clean room. Such arrangement enables optimizing an operating condition of the clean room and achieving energy saving.

3 Claims, 13 Drawing Sheets

FIG. 3
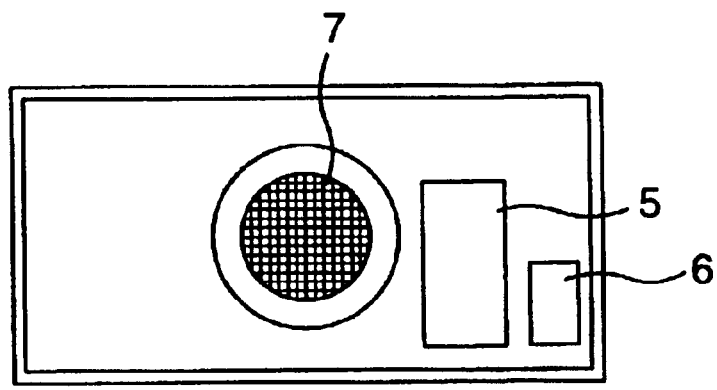
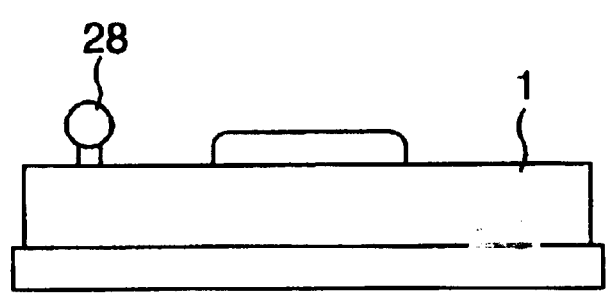
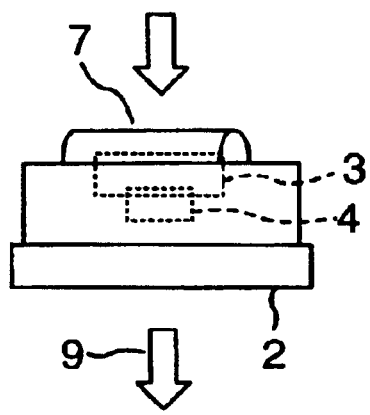

FIG. 7
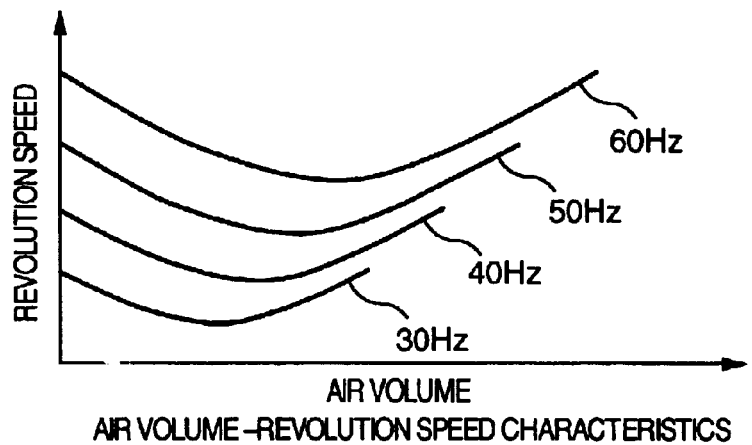
AIR VOLUME–REVOLUTION SPEED CHARACTERISTICS
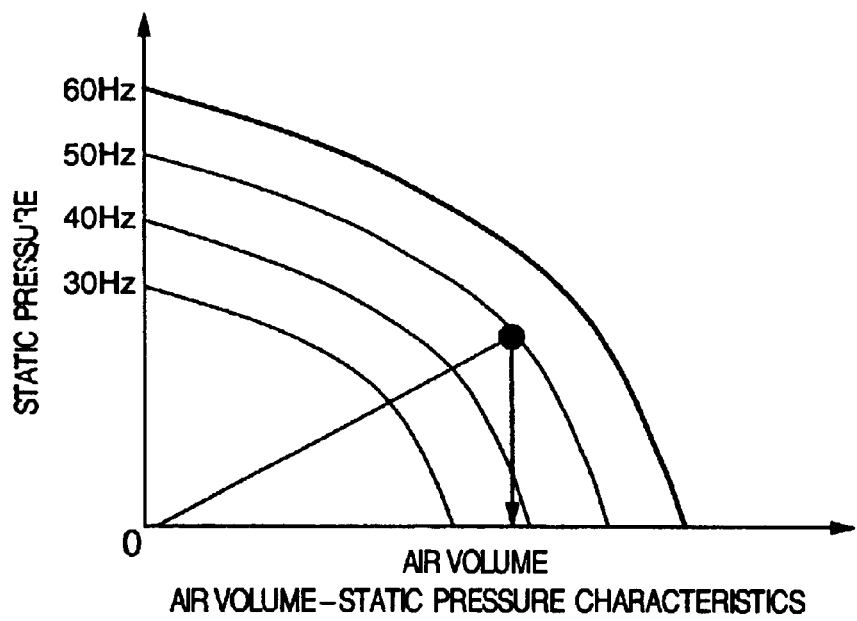
AIR VOLUME–STATIC PRESSURE CHARACTERISTICS
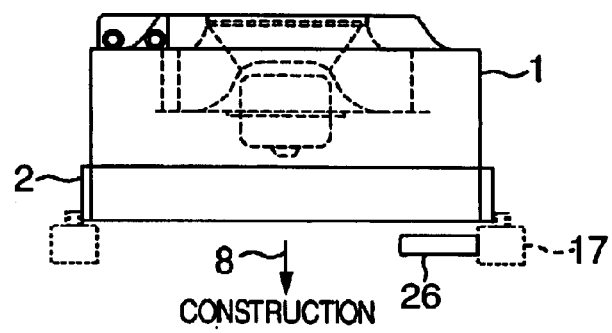

FIG. 8

| FFU NO. | FFU NAME | AREA | GROUP | OPERATION MODE | SPEED SETTING | INTEGRATED OPERATION TIME | SUM OF FAILURE | COMMENT |
|---|---|---|---|---|---|---|---|---|
| 1 | FFU 1 | AREA 1 | GROUP 1 | MANUAL | STOP | 5400 | 0 | FILTER A |
| 2 | FFU 2 | AREA 1 | GROUP 1 | MANUAL | 15 m³/min | 10700 | 0 | FILTER A |
| 3 | FFU 3 | AREA 1 | GROUP 2 | AUTOMATIC | 10 m³/min | 62700 | 0 | FILTER A |
| 4 | FFU 4 | AREA 1 | GROUP 2 | AUTOMATIC | 10 m³/min | 62700 | 1 | FILTER A |
| 5 | FFU 5 | AREA 1 | GROUP 2 | AUTOMATIC | 10 m³/min | 62700 | 0 | FILTER A |
| 6 | FFU 6 | AREA 1 | GROUP 2 | AUTOMATIC | 10 m³/min | 62700 | 0 | FILTER A |

INTEGRATED OPERATION TIME

37

FIG. 11
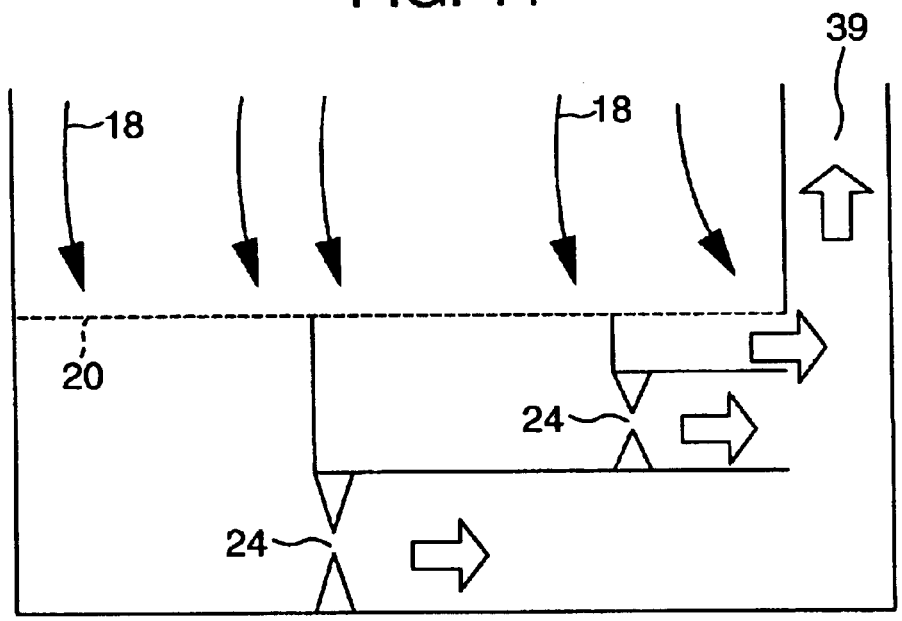
FIG. 12
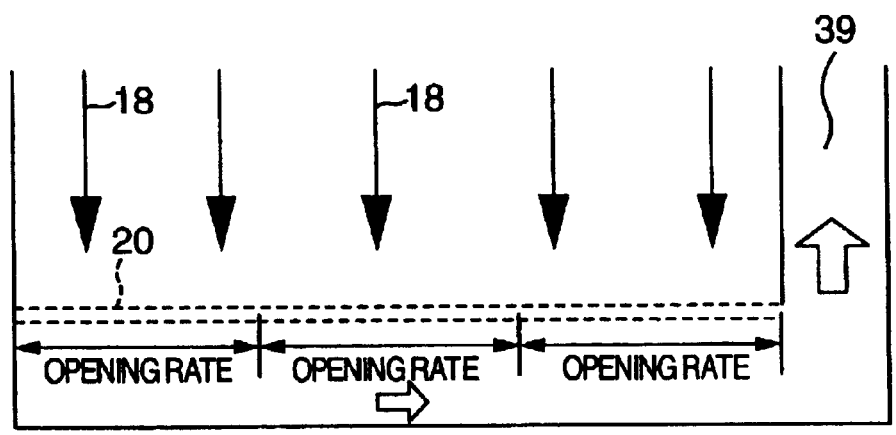
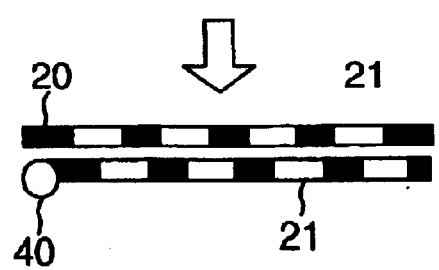

ABNORMALLY STOPPED FFU

FIG. 16
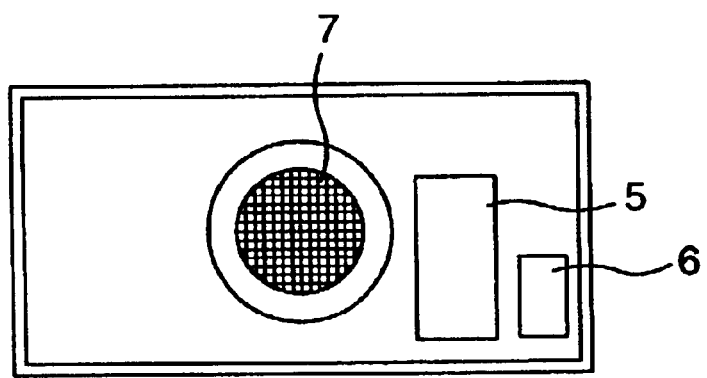
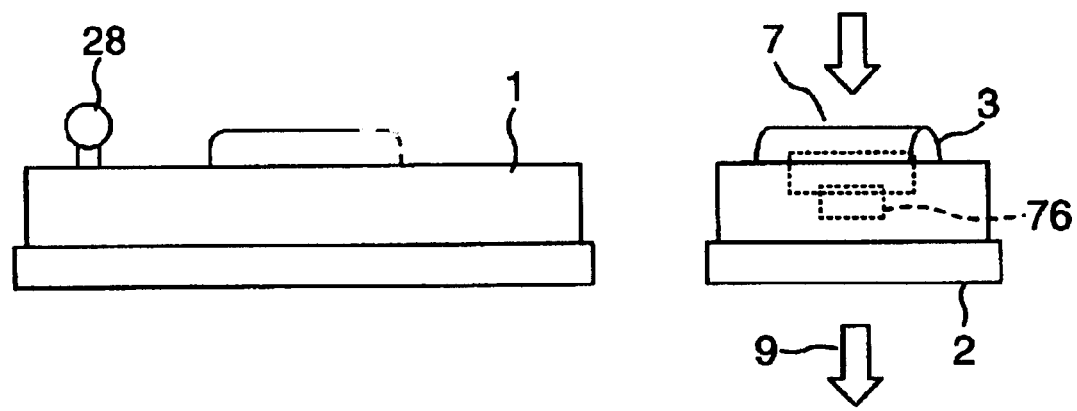

ized in accordance with the number of times of circulation of air flow that varies depending upon a wind velocity, at which the air flow is blown from the FFUs, and the filter grade of HEPA filters, ULPA filters and so on. In recent years, PTFE filters free of generation of boron gases and low-boron filters involving reduction in an amount of boron generated from glass fiber filters are used properly every manufacturing process.
FAN FILTER UNIT CONTROL SYSTEM AND CLEAN ROOM PROVIDED WITH SAME

CROSS REFERENCE TO RELATED APPLICATION

This application is a continuation of U.S. application Ser. No. 10/028,149, filed Dec. 20, 2001, now U.S. Pat. No. 6,607,435 entitled "Fan Filter Unit Control System and Clean Room Provided with Same."

BACKGROUND OF THE INVENTION

The present invention relates to a clean room, in which electronic devices such as semiconductor devices and liquid crystals are manufactured, and more particularly to a fan filter unit control system for controlling the operation of fan filter units (referred below to as "FFUs") provided in a ceiling of the clean room and a clean room equipped with the same.

In general, cleanliness of a clean room is classified into class 1, class 10, class 100 or class 1,000 in accordance with manufacturing processes in the clean room. Such cleanliness is classified in accordance with the number of times of circulation of air flow that varies depending upon a wind velocity, at which the air flow is blown from the FFUs, and the filter grade of HEPA filters, ULPA filters and so on. In recent years, PTFE filters free of generation of boron gases and low-boron filters involving reduction in an amount of boron generated from glass fiber filters are used properly every manufacturing process.

In order to obtain a high level of cleanliness of around class 1 or class 10 in a clean room, not only the number of times of circulation of air flow in the clean room but also directions of air flow in the clean room constitute important factors.

A conventional FFU 1, as shown in FIG. 16, uses a motor 4 to rotate a fan 3 to draw an air through an inlet port 7, and a filter 2 below the FFU 1 filters the air to blow out a clean air 9. Cleanliness in a clean room is maintained by adjusting the velocity and direction of the clean air 9 blown.

As disclosed in JP-A-11-218353 (prior art 1), as a means for adjusting the wind velocity into the clean room from FFUs, pressure difference sensors are provided upstream and downstream of filters of the FFUs to detect static pressures of the filters 2 and calculate the blowing wind velocities of the FFUs from static pressure-air volume characteristic of the filters, thus controlling the wind velocities with the use of a motor revolution speed control means.

Further, JP-A-9-96431 (prior art 2) describes a control method, in which air volume adjusting plates are provided on a floor in a clean room to prevent turbulence in a down-flow in the clean room, and an air volume passing through vents in the floor is measured to provide control so as to ensure a constant air volume.

With the prior art 1 described above, the pressure difference sensors provided in the respective FFUs are used in adjusting the wind velocity of an air blown therefrom, but no account is taken of controlling directions of air flows in the clean room based on information of positions of the FFUs provided in the ceiling of the clean room and pressure in a ceiling chamber.

Also, with the prior art 2, it is described that air volumes of air flows through the vents in the floor of the clean room are measured so as to make air volumes constant on the floor, but no account is taken of controlling an air volume of air flow in the clean room by measuring the wind velocity in the clean room.

As described above, none of the prior arts is insufficient to improve cleanliness in the clean room.

An object of the present invention is to provide an FFU control system capable of controlling directions and air volumes of air flows blown from FFUs provided in a ceiling portion of a clean room in order to improve cleanliness in the clean room.

Another object of the present invention is to provide a clean room provided with a control system that makes pressure in a ceiling chamber uniform and facilitates the revolution speed control on the FFUs in order to improve the wind velocity distribution in the clean room.

Still another object of the present invention is to provide a clean room provided with a damper adjusting mechanism provided under a grating floor in the clean room in order to control the direction of air flow in the clean room.

SUMMARY OF THE INVENTION

To achieve the above objects, the invention provides a fan filter unit control system comprising fan filter units provided in a ceiling of a clean room; and a control device for controlling the fan filter units; and wherein revolution speeds of fan motors for the fan filter units are controlled in accordance with information about positions of the fan filter units and information about pressures detected by differential pressure gauges provided in a ceiling chamber of the clean room.

Also, the fan filter unit control system is constructed such that air volumes calculated after revolution speeds of the fan motors have been controlled are displayed on a control screen.

Also, a clean room comprises the fan filter unit control system and fans provided in a ceiling thereof, and is constructed such that the fans in the ceiling of the clean room are controlled by information from differential pressure gauges provided in a ceiling chamber.

Also, a clean room comprises fan filter units provided in a ceiling of the clean room, a control device for controlling the fan filter units, wind velocity gauges provided in the clean room, and fans provided under a floor of the clean room, and is constructed such that revolutions of the under-floor fans are controlled in accordance with information from the wind velocity gauges.

Also, a clean room comprises fan filter units provided in a ceiling of the clean room, a control device for controlling the fan filter units, wind velocity gauges provided in the clean room, and dampers provided under a floor of the clean room, and is constructed such that the opening ratios of the underfloor dampers are controlled in accordance with information from the wind velocity gauges.

Also, a clean room comprises fan filter units provided in a ceiling of the clean room, a control device for controlling the fan filter units, wind velocity gauges provided in the clean room, and a grating floor of the clean room and adjustable in opening ratio, and is constructed such that the opening ratio of the grating floor is controlled in accordance with information from the wind velocity gauges.

Also, a clean room comprises fan filter units provided in a ceiling of the clean room, a control device for controlling the fan filter units, and differential pressure gauges provided in the fan filter units, and is constructed such that the service lives of the fan filter units are calculated based on information from the differential pressure gauge provided in the fan filter unit and are displayed on a screen.

BRIEF DESCRIPTION OF THE DRAWINGS

FIG. 3 is a view showing an FFU construction according to the first embodiment of the invention.

FIG. 7 is an air volume-static pressure characteristic diagram of an inverter-controlled FFU according to the first embodiment of the invention.

FIG. 8 is a display screen showing of information of FFUs according to a second embodiment of the invention.

FIG. 11 is a view showing the construction under a clean room floor according to a fifth embodiment of the invention.

FIG. 12 is a view showing the construction of a clean room grating floor according to a sixth embodiment of the invention.

FIG. 16 is a view showing the construction of a conventional FFU construction.

DETAILED DESCRIPTION OF THE EMBODIMENTS

Now, the present invention will be described with reference to the accompanying drawings.

<First Embodiment> (Ceiling Differential Pressure Gauge)

Figure 1:
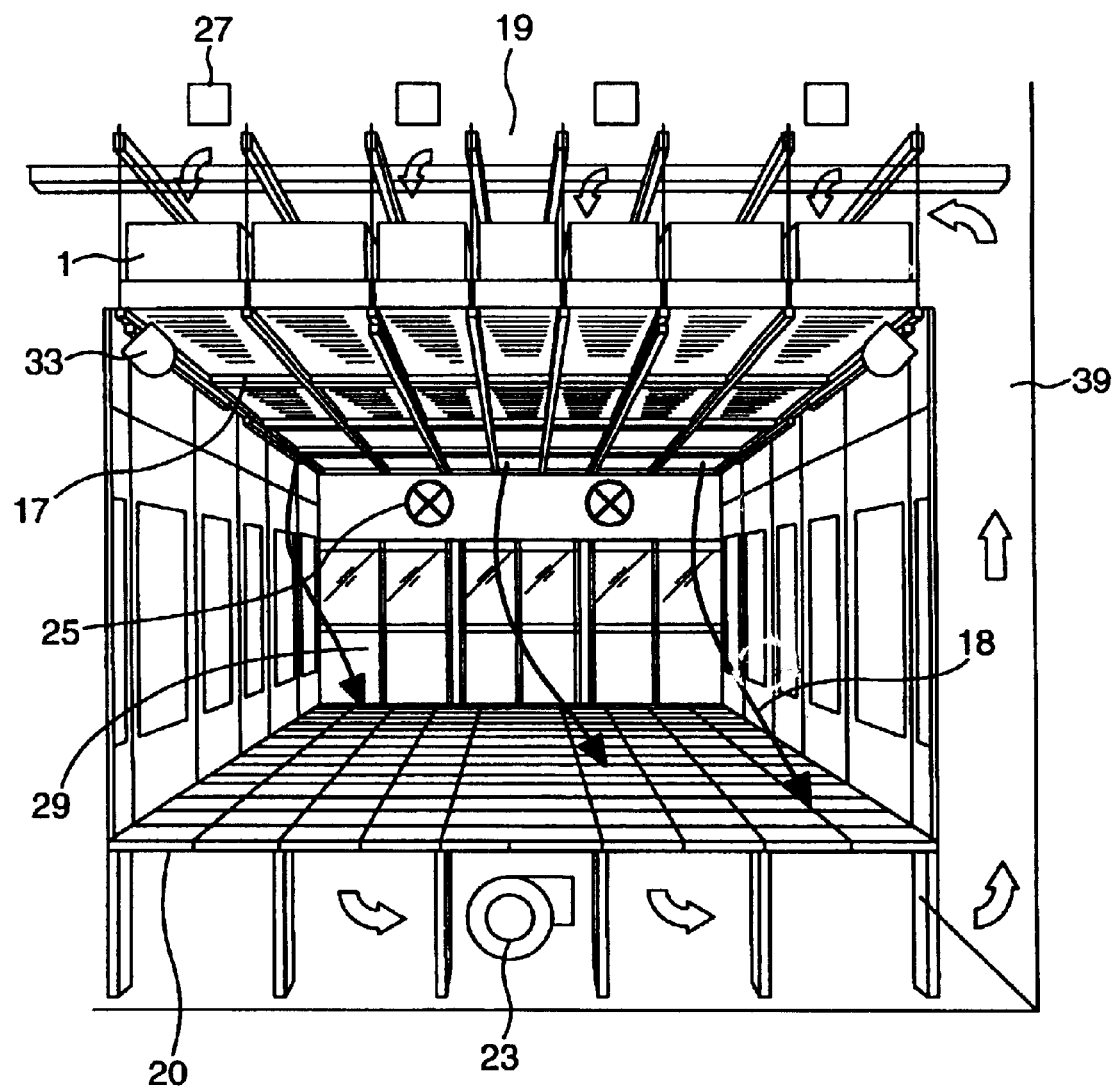
FIG. 1 is a view showing an FFU construction according to a first embodiment of the invention.

FIG. 1 shows a clean room equipped with an FFU control system according to a first embodiment of the present invention.

In FIG. 1, a ceiling aluminum frame 17 is laid on a ceiling surface of the clean room in a lattice fashion, and FFUs 1 are installed on the ceiling aluminum frame 17. The FFUs 1 draw in an air in a ceiling chamber 19 and blow out cleaned air into the clean room. The cleaned air makes an air flow 18 in the clean room to pass through a grating floor 20 of the clean room to flow thereunder and return from a return area 39 into the ceiling chamber 19. In this way, the cleaned air is circulated to clean the clean room.

In the present invention, differential pressure gauges 27 are installed at several locations in the ceiling chamber 19.

The differential pressure gauges 27 are arranged in the manner described below.

Figure 2:
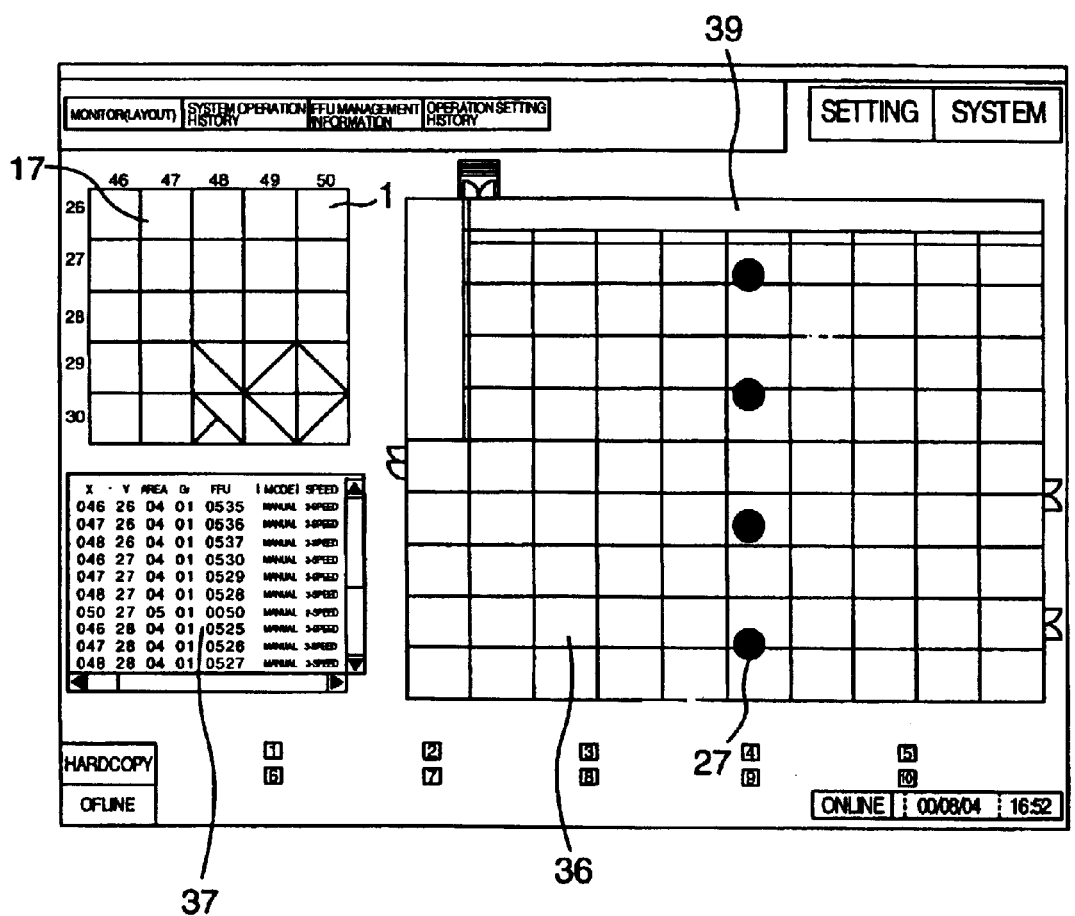
FIG. 2 is a view showing a control screen of an FFU control system according to the first embodiment of the invention.

FIG. 2 shows the FFU control system of this invention on a display screen. The screen displays a layout in the clean room, i.e., the arrangement of the FFUs and differential pressure gauges and information on the FFUs. The layout of the clean room is shown on a layout image 36, at the top of which is shown the return area 39. The ceiling chamber differential pressure gauges 27 are positioned on the layout image 36 in a manner shown by solid circles and arranged in a column. The reason for such columnar arrangement will be described later.

There is no need of displaying the ceiling chamber differential pressure gauges 27 on the screen when the positional information thereof is specified in the FFU control system. An upper left portion of the layout image 36 has the function of enlargement to be capable of magnified displaying. The gratings on the layout image indicate the ceiling aluminum frame 17, each grating representing one FFU 1. Marks X on the ceiling aluminum frame 17 indicate locations where the FFUs 1 are not mounted on the ceiling aluminum frame 17.

An FFU information display image 37 displays coordinates of positions where FFUs 1 are installed, designations of defined areas, designations of defined groups, management numbers of FFUs, modes of operation, and operating speeds so that information is known for each of FFUs. To control FFUs 1, management of positional coordinates for FFUs 1 is important in corresponding to the floor layout. When controlled, several FFUs 1 in a lump often act in the same manner operation, and so that the FFUs are defined in terms of areas and groups. Thus it is possible that several FFUs be specified as one group and several groups as one area. In the manufacture of electronic devices, such as semiconductor devices and liquid crystals, the areas are allotted every job in various manufacturing processes and in each area the groups are allotted every manufacturing equipment to perform wind velocity control of FFUs for an optimum wind velocity distribution.

Next, an explanation will be given to the FFU of this invention.

FIG. 3 shows the construction of the FFU of this invention. The FFU 1 is provided with an inlet port 7 at the top of its body, through which port an air is drawn in by rotation of a fan 3 with a motor 4 in the body and then filtered through a filter 2 to be discharged as a clean air 9. This invention uses a DCBL motor or an inverter for the revolution speed control of the motor 4. A motor controller 5 is loaded on an upper part of the FFU 1 and is controlled from outside via a communication branch station 6.

With this invention, as shown in FIGS. 1 and 2, information from the ceiling chamber differential pressure gauges 27 is taken in the FFU control system to control the FFUs 1. When the return area 39 is arranged on one side of the clean room, as shown in FIG. 1, the air flow 18 from the FFUs 1 is blown out into the clean room and then drawn into the return area 39, so that there is generated a slant flow phenomenon, in which such air flow in the clean room does not flow vertically in the clean room.

In order to avoid this slantwise flow phenomenon, a space under the grating floor is generally made large in dimension. However, there have been produced circumstances that large sizing of manufacturing equipments in recent years makes it necessary to increase a clean space in size, which makes it difficult to secure a large underfloor space.

The air flow having passed through the return area 39 returns to the ceiling chamber 19 to be successively drawn into the FFUs 1 disposed on the side of the return area 39. When the ceiling chamber 19 can be set large in height, the air flow moving in the ceiling chamber 19 is slow in speed, and when the ceiling chamber 19 is small in height, the air flow moving in the ceiling chamber 19 becomes large in speed, thus increasing an external static pressure due to flow resistance. Further, since a distance, over which the air flow moves in the ceiling chamber 19, is different between the return area 39 side and the inner part of the ceiling chamber 19, there is generated a distribution of the external static pressure in the ceiling chamber 19. In the first embodiment, the ceiling chamber differential pressure gauges 27 are arranged in each column to correspond to the external static pressure distribution.

Next, an explanation will be given to the control system for the FFU of this invention.

Figure 4:
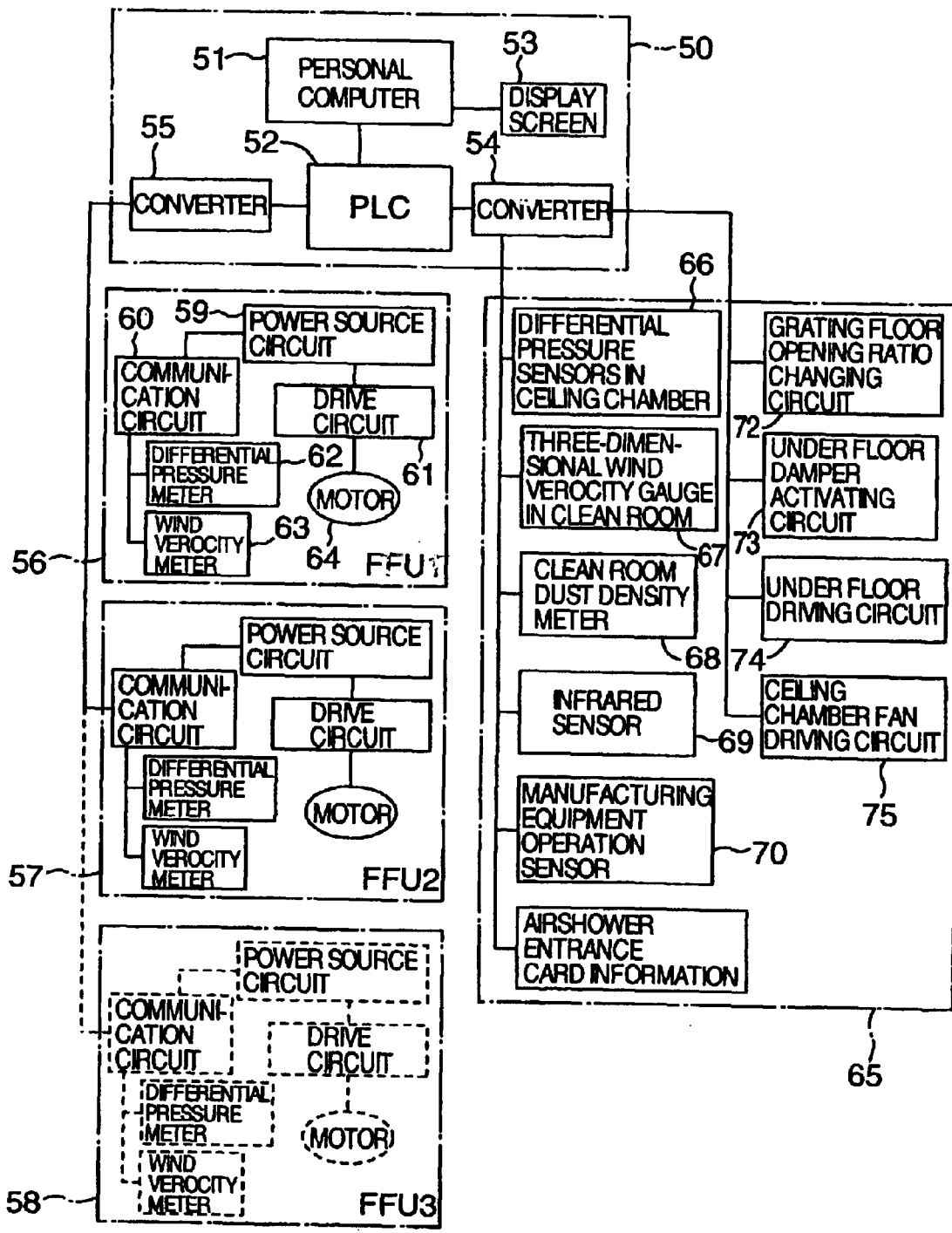
FIG. 4 is a control block diagram of the FFU control system according to the invention.

FIG. 4 is a block diagram of the FFU control system of FIG. 1. In FIG. 4, the FFU comprises a power supply circuit 59, a motor 64, a drive circuit 61 for driving the motor 64, a communication circuit 60 for controlling a revolution speed of the motor 64 from outside, a differential pressure gauge 62 for measuring air pressures at the time of being drawn into the FFU 1 and being blown out therefrom, and a wind velocity gauge 63 for measuring a wind velocity at the time of being blown into the clean room. A plurality of FFUs of the same construction are arranged. These FFUs are monitored by a monitoring room 50, which is composed of a personal computer 51 having a control program, a PLC (programmable logic controller) for receiving a control command from the personal computer 51 to control the FFUs and the like, a converter 55 for converting the information from the PLC into a control command, and a display screen 53 for displaying a control status of the FFUs.

In a clean room 65, there are provided differential pressure sensors 66 arranged in the ceiling chamber of the clean room, a clean room three-dimensional wind velocity gauge 67 for measuring three-dimensional wind velocity in the clean room, a clean room dust density meter 68, an infrared sensor 69 for detecting a worker, a manufacturing equipment operation sensor 70 for detecting the operation of manufacturing equipments, a grating floor opening ratio changing circuit 72 for changing the opening ratio of the grating floor of the clean room, an underfloor damper actuating circuit 73 for actuating underfloor dampers of the clean room, an underfloor fan driving circuit 74 for driving fans installed under the floor, and a ceiling chamber fan driving circuit 75 for driving fans installed in the ceiling chamber, from which the personal computer 51 in the monitoring room receives and delivers information to control them.

In FIG. 4, the communication circuits in the FFUs are supplied with power from the power supply circuits of the FFUs. This is because even when power supply for the personal computer and PLC in the monitoring room should fail, the FFUs can continue to operate provided that the power supply on the FFUs are available. This operation is enabled by the communication circuit loaded on the FFUs storing a previous command value until the next one comes along.

Figure 5:
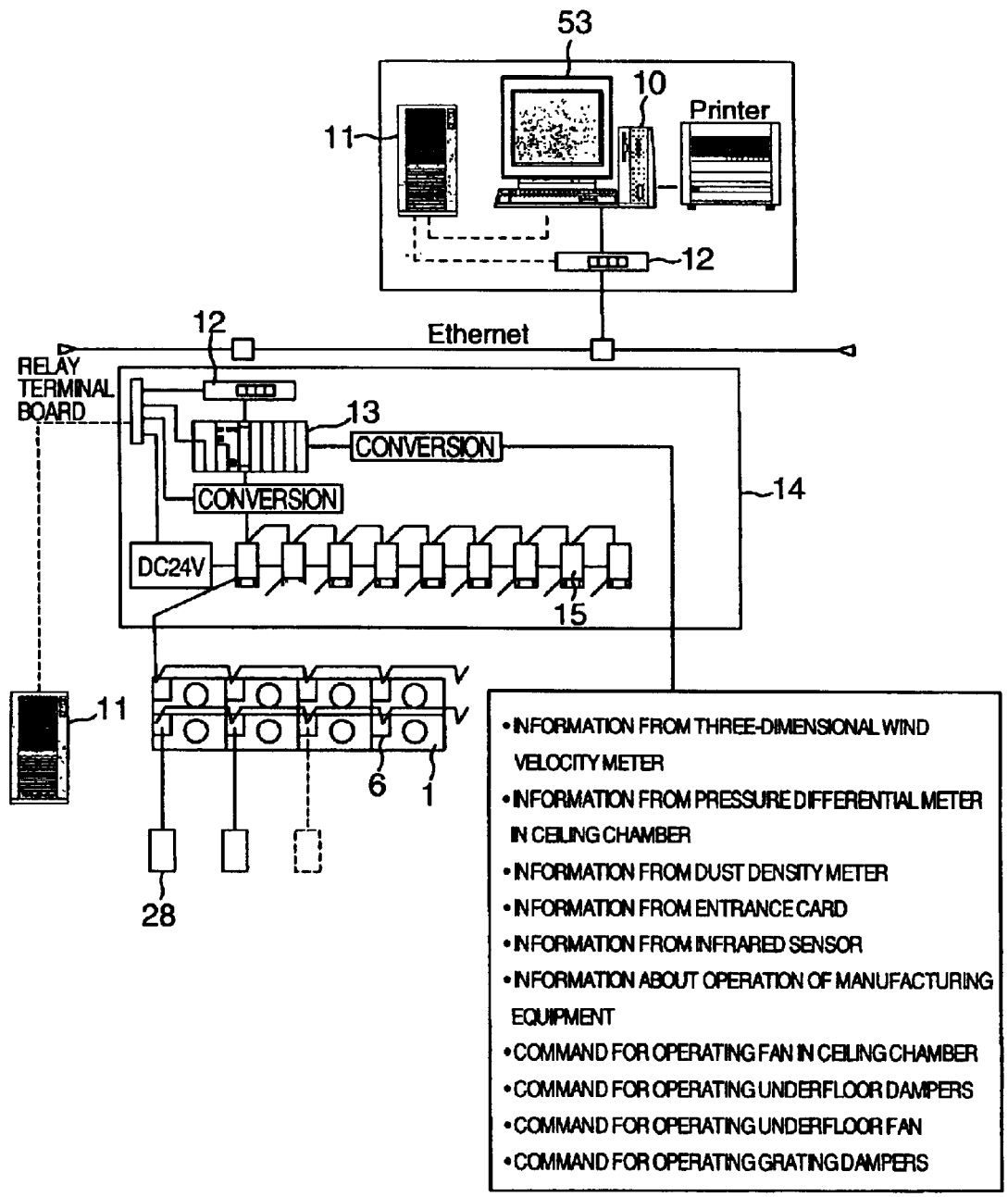
FIG. 5 is a view showing a system configuration according to a seventh embodiment of the invention.

The control block diagram of the FFU control system in FIG. 4 is more concretely shown in a system configuration of the FFU control system in FIG. 5.

In FIG. 5, a signal from the personal computer 10 in the monitoring room is input into a PLC 13 via a hub 12 and the Ethernet from a hub 12 of a control panel 14. A signal of the PLC 13 is transmitted through an interface unit 15 to a communication branch station 6 of the FFU 1 connected to each interface unit 15. The personal computer 10 and the PLC 13 in the monitoring room are supplied with power form a UPS 11 by way of precaution against power failure, but they may be supplied with power from a utility power.

In this invention, information from the differential pressure gauges in the clean room ceiling chamber is input into the PLC 13 through a converter. While this information may be taken into the personal computer 10 in the monitoring room, it is taken into the PLC 13 in this embodiment for the purpose of reliability in the equipment.

Next, the characteristics of the FFU will be described.

Figure 6:
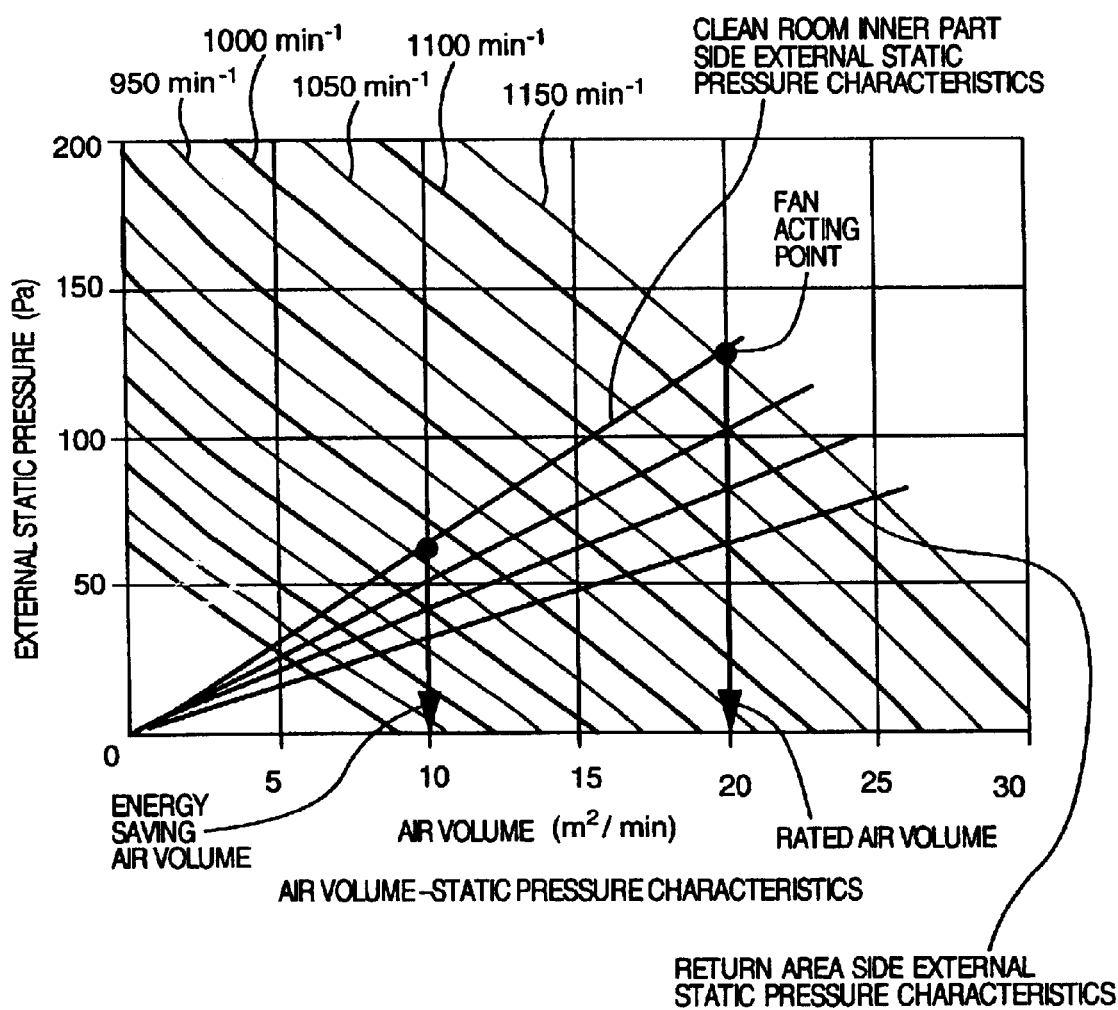
FIG. 6 is an air volume-static pressure characteristic diagram of the FFU according to the first embodiment of the invention.

FIG. 6 shows an air volume-static pressure characteristic of the FFU according to this invention. The fan performance curves with the DCBL motor presents an air volume and a static pressure determined every revolution speed as shown in FIG. 6 and even if the characteristic for respective revolution speeds is not known, the fan performance is such that the air volume is proportional to a revolution speed ratio and the static pressure is proportional to the square of the revolution speed ratio, so that it is possible to estimate the performance at each revolution speed with high precision. Accordingly, a revolution speed command value required to obtain a necessary air volume can be determined from the air volume-static pressure characteristic provided that the external static pressure condition is known. In the case where the return area 39 is provided on one side of the clean room as shown in FIG. 1, the external static pressure on the return area 39 side is small while the external static pressure on the inner part of the clean room opposite to the return area becomes large. The external static pressure information is taken into the FFU control system from the differential pressure gauges 17 in the ceiling chamber 19. Because the FFU information in this system includes positional information, the static pressure outside the FFU at a particular position at present can be determined by defining coordinates of positions of the FFUs covered by each of the differential pressure gauges 27. The more the number of differential pressure gauges 27 installed in the ceiling chamber and the less the number of FFUs covered by the respective differential pressure gauges 27, the more precisely control can be performed. This external static pressure information makes it possible to determine at what revolution speed a DCBL motor for a particular FFU should be operated to obtain a desired volume of air. The revolution speed of an associated DCBL motor is issued to the associated FFU to control an air volume. For example, when the external static pressure information is 70 Pa, it is found that in order to obtain an air volume of 20 m$^3$/min, an DCBL motor may be rotated at a revolution speed of 1000 min$^{-1}$. In the case where the pressure distribution in the ceiling chamber after installation is known at a first time and taken as a decision condition into the control system, abnormality can be judged and output when the external static pressure higher than the initial value comes out.

Even when FFUs are reduced in air volume, cleanliness can be in some cases maintained on the occasion of the number of people working being small holidays or in areas where the manufacturing equipment is not running. Energy saving can be achieved by reducing an operating air volume of the FFUs. When the operating air volumes of FFUs decrease and then the air volume in the ceiling chamber 19 decreases, the flow resistance also decreases, which in turn lowers the external static pressure. Even when the external static pressure lowers, a motor operating revolution speed can be determined from the air volume-static pressure characteristic on the basis of the differential pressure gauges 27 and the air volume required at the time of energy saving operation, and then a command of revolution speed can be issued to associated FFUs 1.

FIG. 7 shows an air volume-static pressure characteristic of the inverter-controlled FFU according to the present invention. With inverter control, in order to control the power frequency for a three-phase induction motor, the motor is operated at a point in the characteristic where the motor torque, the revolution speed and the work of air volume times static pressure are balanced for a particular power frequency. Therefore, when the FFU control system of this invention issues an inverter power frequency command for a fan performance control, it is required that the air volume-static pressure characteristic for respective power frequencies be known. When the air volume-static pressure characteristic for respective power frequencies is not known, there is a control method in which wind velocity gauges 26 are mounted on the ceiling aluminum frame 17, on which the FFUs 1 are installed, to have the wind velocity information taken into the FFU control system. The control block diagram for this method is shown in FIG. 4. The wind velocity information from these gauges on the FFUs is transmitted to the PLC and the personal computer via the communication circuit of each FFU. The wind velocity information from the wind velocity gauges is fed back to the inverter power frequency of each FFU to control the operating air volume.

In this way, the FFU performance can be automatically controlled according to the external static pressure distribution in the ceiling, thus shortening a period of time taken in adjusting the air flow at the time of installation of the clean room.

<Second Embodiment> (Indication of Air Volume)

FIG. 8 shows an FFU information display screen in a second embodiment of the invention. Command signals issued to FFUs from a FFU control system include a revolution speed command and a power frequency command. Even when these command signals are the same in value, an air volume may vary depending on the condition of static pressures outside the FFUs. An administrator of the clean room facility must manage an operating air volume, not the revolution speed command value. With the present system, it is knowable with respect to each of the FFUs how much the external static pressure is, at what speed the fan is rotating and how much an air volume is. Accordingly, velocity setting columns in the FFU information display image 37 can be filled with air volumes. Even when the same air volumes are displayed, operation is performed in the control system at different revolution speed command values according to differences in static pressure outside positions where these FFUs are installed.

As stated above, the revolution speed command values and the external static pressure information are used to calculate air volumes disposed by the FFUs and display them, so that adjustment of disposed air volume serving as a measure for calculation of cleanliness can be made precise to afford an appropriate operation of the clean room.

<Third Embodiment> (Ceiling Fan)

Figure 9:
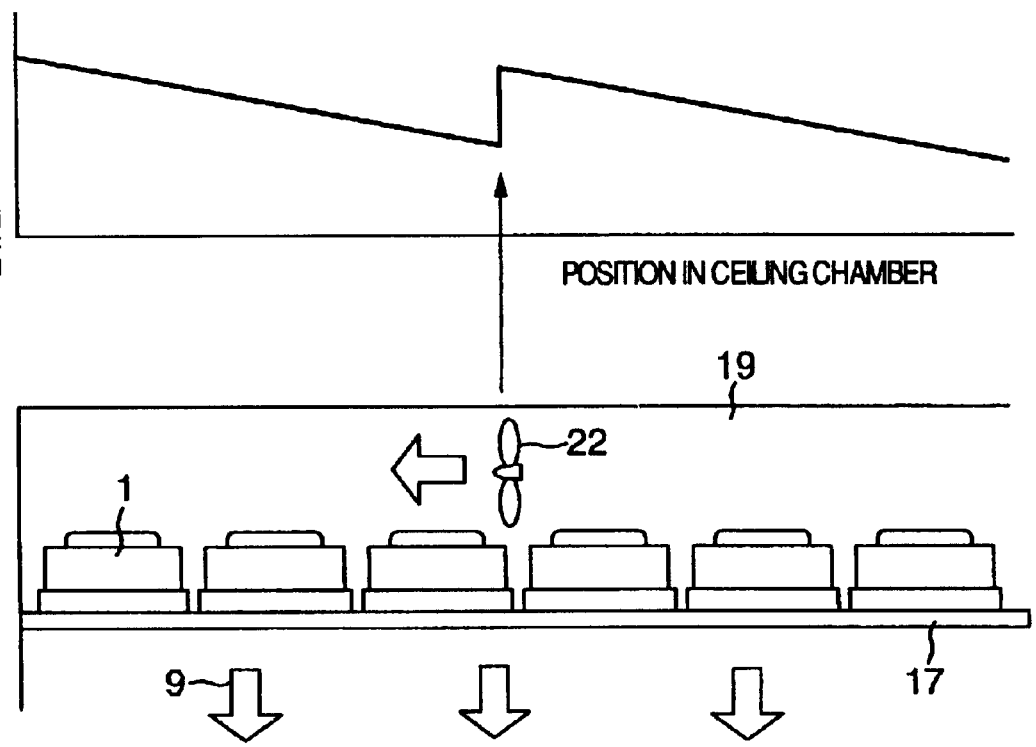
FIG. 9 is a view showing the construction of FFUs according to a third embodiment of the invention.

FIG. 9 shows an FFU arrangement according to a third embodiment of the invention. The external static pressure in the ceiling chamber 19 is influenced by air volume drawn by the FFUs 1 to rise toward the inner part of the ceiling chamber. The lower the height of the ceiling chamber above the FFUs 1 become more, the conspicuously such phenomenon exhibits itself. When the external static pressure becomes large, work done by the fan increases when a fan motor for the FFUs 1 is increased in revolution speed to produce a desired air volume even at the time of the external static pressure being high. There is, however, caused a drawback that an increased revolution speed also results in an increased noise. In the third embodiment, a fan 22 is installed in the ceiling chamber as shown in FIG. 9 to compensate for the static pressure in the inner part of the clean room ceiling. As shown in the graph of FIG. 9, the external static pressure in the ceiling chamber increases raised toward the inner part of the ceiling chamber but temporarily decreases due to compensation of the static pressure done by the fan 22 in the ceiling chamber, after which it again increases toward the inner part. This fan 22 in the ceiling chamber can maintain the static pressure in the chamber uniform over the entire clean room.

As shown in the control block diagram of FIG. 4, the control system controls the operation of the fan 22 in the ceiling chamber whereby the differential pressure information from the differential pressure gauge in the ceiling chamber enables a more precise control with feedback.

<Fourth Embodiment> (Three-Dimensional Wind Velocity Gauge and Underfloor Fan)

Figure 10:
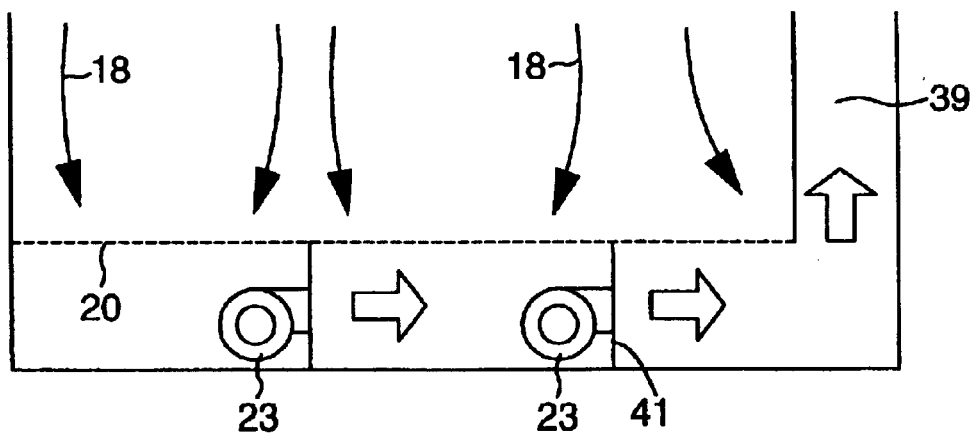
FIG. 10 is a view showing the construction under a clean room floor according to a fourth embodiment of the invention.

FIG. 10 shows a construction under a clean room according to a fourth embodiment. As shown in the figure, a clean room grating underfloor space is divided into several spaces and underfloor fans 23 are provided on partitioning members 41. The underfloor spaces divided by the partitioning members 41, respectively, are under different negative pressures depending on the performances of the underfloor fans 23. Without any partitioning member 41, an air flow within the clean room is influenced by the negative pressure under the grating floor toward the return area 39 to be drawn into the grating floor. In order to ensure that the air flow in the clean room is drawn vertically into the grating floor, the underfloor space is set to a large depth to reduce variations in the negative pressure distribution below the grating floor. When the underfloor space cannot be set to an adequate depth, the negative pressure under the floor is large on the return area 39 side and small on the inner part of the clean room due to the flow resistance under the floor. Hence, the air flow 18 in the clean room is a slantwise flow as a whole to the return area side. In this invention, in order to eliminate the negative pressure distribution variation under the grating floor, an underfloor space is divided into several spaces and the underfloor fans 23 are used to reduce such variation.

FIG. 1 shows an exemplary arrangement of the three-dimensional wind velocity gauges in the clean room according to the fourth embodiment of the invention. FIG. 4 also shows a control block diagram for controlling the underfloor fans according to the three-dimensional wind velocity information. The provision of the three-dimensional wind velocity gauges 25 in the clean room reveals how the air flow is directed in the clean room. This invention controls the underfloor fans 23 on the basis of such three-dimensional wind velocity information. For example, when the three-dimensional wind velocity information indicates that the air flow 18 in the clean room is directed toward the return area 39, it is transmitted to the control system, which in turn enhances the capability of the underfloor fans 23 on the side opposite to the return area to raise the negative pressure below the grating floor to the same side. This causes the air flow, which is directed toward the return area, to be drawn by the negative pressure on a side opposite to the return area. When a plurality of underfloor fans 23 are installed, a more fine control can be made using information from the three-dimensional wind velocity gauges 25 in the clean room. FIG. 5 shows an FFU control system configuration in the case where the three-dimensional wind velocity gauges and the underfloor fans are used. Information from the three-dimensional wind velocity gauges is taken into the PLC 13 through the converter, and the information thus taken in is used to determine in which direction the air flow is moving, whereby a command value is issued to the underfloor fans 23 to correct the direction of air flow. A means for adjusting the performance of the underfloor fans includes an inverter or the like.

As described above, the slantwise flow in the clean room can be controlled by the underfloor fans.

<Fifth Embodiment> (Three-Dimensional Wind Velocity Gauges and Underfloor Damper)

FIG. 11 shows a construction under the clean room according to a fifth embodiment. As in the fourth embodiment, the three-dimensional wind velocity gauges 25 are provided in the clean room as shown in FIG. 1 to measure an inflow angle of the air flow 18 in the clean room. The underfloor space is partitioned into several spaces as shown in FIG. 11, in each of which an underfloor damper 24 is installed. The underfloor space is thus divided into several partitioned spaces, whereby the negative pressure in each partitioned space can be adjusted as in the fourth embodiment. The air flow under the floor is drawn by the negative pressure in the return area 39. Dampers are provided in the partitioned underfloor spaces to afford adjustment of the negative pressure distribution on the return area side and on the opposite side. For example, when the air flow 18 in the clean room is directed toward the return area side, the damper 23 in the inner part of the partitioned space is opened to increase the underfloor negative pressure in the inner part of the clean room, whereby the air flow 18 in the clean room is drawn by that negative pressure to pass into the grating floor on the inner part of the clean room. An increase in the number of underfloor partitioned spaces affords a more precise control made by the three-dimensional wind velocity gauges 25 in the clean room and the underfloor dampers 24. A control block diagram of the fifth embodiment is shown in FIG. 4. The information on the three-dimensional wind velocity in the clean room is used to determine the direction of air flow in the clean room, and the underfloor dampers in the underfloor partitioned spaces are opened, to which spaces the air flow should be directed. This control makes it possible to control the air flow 18 in the clean room in a vertical manner.

The procedure described above enables controlling the slantwise air flow in the clean room with the underfloor dampers.

<Sixth Embodiment> (Three-Dimensional Air Velocity Gauges and Grated Openings)

FIG. 12 shows a construction of a clean room grating floor according to a sixth embodiment. This figure shows a state where the grating floor opening ratio is controlled to 60%, 40% and 20% from the side opposite to the return area. The opening ratio of the grating floor is thus varied whereby the air flow is easy to pass at locations of large opening ratio and hard to pass at locations of small opening ratio. Therefore, when the air flow 18 in the clean room is directed toward the return area side, the air flow 18 in the clean room is made to be directed toward the side opposite to the return area by making the opening ratio of the grating floor small on the return area side and making the grating opening ratio large on the side opposite to the return area. In this manner, the air flow 18 in the clean room can be controlled to be made slantwise by controlling the opening ratio of the grating floor. Adjustment of the opening ratio of the grating floor can be made by operating a grating floor opening operating portion 40, as described in the prior art 2. In the sixth embodiment, the opening ratio of the entire grating floor is separately controlled by the FFU control system in accordance with the information from the three-dimensional wind velocity gauges 25 shown in FIG. 1. A block diagram for this control is shown in FIG. 4. Information from the three-dimensional wind velocity gauges is used to determine the direction of air flow 18 in the clean room. When the air flow in the clean room is directed toward the return area side, the opening ratio of the grating floor is made large on the side opposite to the return area and small on the return area side. This causes the air flow 18 in the clean room to flow vertically. When the air flow runs slantwise on the opposite side, it suffices that the opening ratio on the side opposite to the return area be made small and the air flow be fed back. The grating floor generally measures 600 mm×600 mm in each grated opening, and the opening ratio is separately controlled for openings of the grating floor as in the sixth embodiment while the air flow 18 in the clean room is measured by the three-dimensional wind velocity gauges 25, so that it is possible to perform a more fine control.

As described above, the slant flow control for the air flow in the clean room can be performed by using the three-dimensional wind velocity gauges and changing the opening ratio of the grating floor.

<Seventh Embodiment> (Differential Pressure Gauges and Filter Life)

Figure 13:
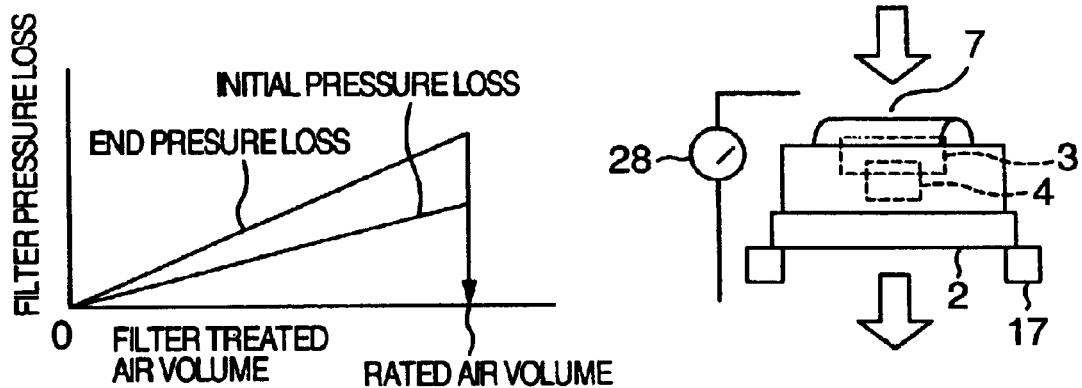
FIG. 13 is a view showing the construction of an FFU according to a seventh embodiment of the invention and a filter characteristic.

FIG. 13 shows the construction of a FFU and a filter characteristic according to a seventh embodiment. A FFU differential pressure gauge 28 is mounted in a pressure chamber of the FFU 1. An air drawn from the inlet port 7 is pressurized in the FFU and then passed through a filter 2 to be discharged as a clean air. The filter characteristic is such that the pressure loss is small as shown in FIG. 13 at the initial stage of use but increases as dust accumulates in use. The increased pressure loss can be used to judge the service life of the filter. In the seventh embodiment, the service life of the filter is indicated with the use of the pressure loss information. A block diagram of such control is shown in FIG. 4. Differential pressure gauges are mounted on the respective FFUs 1 and information of their differential pressures is transferred to communication circuits for the respective FFUs. The communication circuits for the respective FFUs are individually numbered, and so information of the differential pressures on the respective FFUs is separately transmitted to the control system. Accordingly, judgement pressure information for judging an end differential pressure is defined in the control system, and so the service life of the respective FFUs can be determined. FIG. 5 shows a system configuration according to a seventh embodiment. As shown in FIG. 5, information from the differential pressure gauges 28 is transmitted to the communication branch stations 6 of the respective FFUs, from which it is further sent to the control system as the differential pressure information for individual FFUs. Since such information is available for each of the FFUs, the service life of the respective FFUs can be determined with the use of information and end differential pressure for the respective FFUs even if different filters are used for various manufacturing processes and initial pressure losses and end losses are different.

As described above, a clean room system can be realized, in which the service life for the respective FFUs can be precisely known.

<Eighth Embodiment> (Air Shower Entrance Management)

Figure 14:
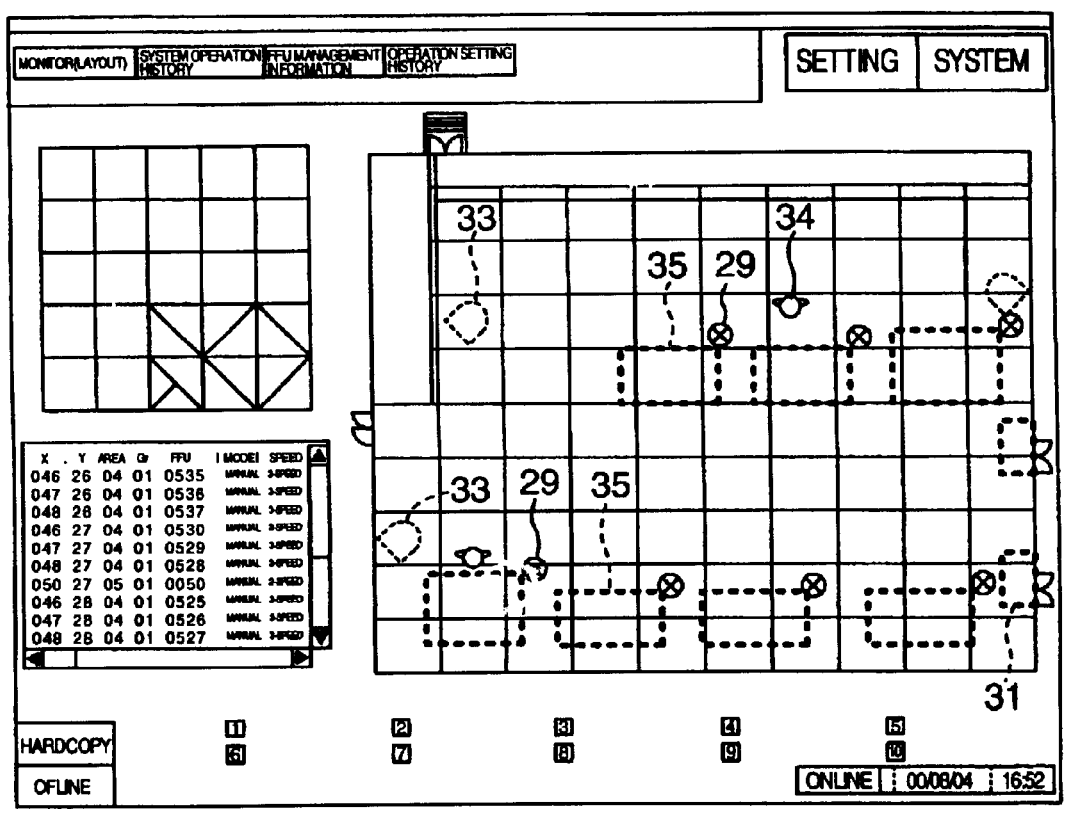
FIG. 14 is the layout of a clean room according to an eighth embodiment of the invention.

FIG. 14 shows the layout of a clean room according to an eighth embodiment. In the figure, the clean room system is shown as overlapping a fan filter unit control monitor screen for the purpose of explanation. A worker 34, who will work in the clean room, passes through an air shower 31 brushing away dust attached to his or her body before entering the clean room. This is intended for bringing no dust into the clean room in order to maintain cleanliness in the clean room. Sources of dust in the clean room include personnel, to who attention should be paid to the utmost, as well as the manufacturing equipment 35. Therefore, the more the number of personnel in the clean room, the more dust. Taking this into consideration, the eighth embodiment provides for adjustment of the air flow blown off the FFUs 1 in accordance with the number of personnel present in the clean room. FIG. 5 shows a block diagram of this control according to the eighth embodiment. The air shower is provided with room entrance cards, and a person to enter into the clean room is sure to put his or her entrance card into the air shower to enter the clean room, whereby it becomes possible to take charge of when and who enters the clean room. When a person is to exit from the clean room, the entrance (exit) card is used to enable the control system to know how many people are present in the clean room. When the number of people in the clean room is known, the control system can estimate an amount of dust on the basis of such number and issue a command signal to the fan filter unit to increase an air volume treated. Similarly, when the number of people in the clean room decreases, it is possible to reduce an air volume treated by the fan filter unit to the minimum required level for energy saving.

As described above, an air volume treated by the FFUs can be controlled conformed to the number of people present in the clean room (corresponding to an amount of dust), and energy saving operation of the clean room is made possible by not increasing the wind velocity beyond necessary.

<Ninth Embodiment> (Infrared Sensors)

FIG. 14 shows a layout of a clean room according to a ninth embodiment. Infrared sensors 33 are arranged in the clean room to monitor infrared information. FIG. 5 shows a control block diagram according to the ninth embodiment. Information from the infrared sensors 33 is transmitted to the personal computer via the PLC. The infrared sensor information indicates locations of high temperature in the clean room. When a heat source is present in the manufacturing equipment, it is not varied in its position. Persons as heat sources move, of which information from the infrared sensors is used to permit the control system to check how many people are present in the clean room. Like the eighth embodiment, the number of people present in the clean room can be used to control the wind velocities of the FFUs.

As described above, an air volume treated by the FFUs can be controlled conformed to the number of people present in the clean room (corresponding to an amount of dust), and energy saving operation of the clean room is made possible by not increasing the wind velocity beyond necessary.

<Tenth Embodiment> (Dust Density Meter)

FIG. 14 shows a layout of a clean room according to a tenth embodiment. Dust density meters 29 are located at desired locations in the clean room. FIG. 5 shows a control block diagram according to the tenth embodiment. Information from the dust density meters is transmitted to the personal computer via the PLC. When taking-in of information from the dust density meters is defined, information on positions of the dust density meters in the clean room is also defined. Since the control system possesses information for positions of the respective FFUs, it is found on the side of the control system which FFU is arranged on each of the dust density meters. Accordingly, control is made possible to rapidly clean a space by increasing the wind velocity or velocities of those FFUs, which are located where dust is high in density. Similarly, the FFUs located where an amount of dust is small can be reduced in amount of treated air volume to the minimum required level.

As described above, control on the wind velocities of FFUs is made possible conformed to locations in the clean room where an amount of dust is large or small, so that the clean room can be operated efficiently.

<Eleventh Embodiment> (Backup in the Event of FFU Failure)

Figure 15:
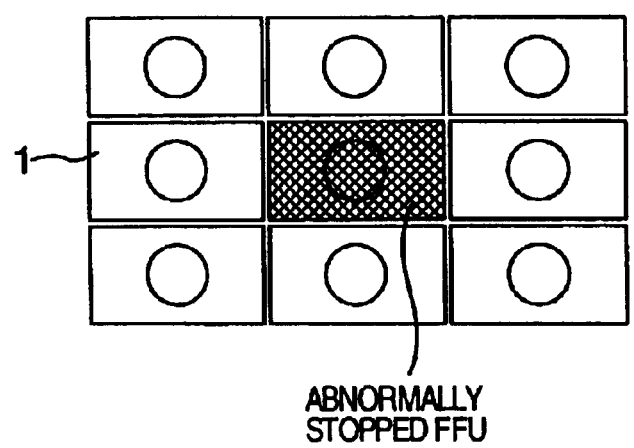
FIG. 15 is the layout illustrating an FFU control according to an eleventh embodiment of the invention.

FIG. 15 shows a layout of FFU control according to an eleventh embodiment. In order to maintain cleanliness in the clean room, it is essential to keep an air volume treated by the FFUs. If a certain FFU should fail and stop, it would become difficult to maintain cleanliness directly below the failed FFU. Because the present control system possesses positional information of the FFUs, it can issue a command to FFUs, which are arranged around the failed FFU, to increase their air volumes. Thus the FFUs arranged around the failed FFU are increased in wind velocity, whereby cleanliness in the space around these FFUs can be maintained. The FFU, in which abnormality is generated, is displayed on the control screen so that the clean room facility administrator can take a necessary measure to make the FFU normal. The FFUs around the FFU having failed return to normal operation when it is found that there is no abnormal FFU around them.

As described above, it is possible to provide a control system which can minimize a reduction in cleanliness of air flow even when a FFU or FFUs fail.

<Twelfth Embodiment> (Filter Service Life in Terms of Integrated Operation Hours)

FIG. 8 shows a screen, on which information about FFUs are displayed, according to a twelfth embodiment. When the filters are to be determined with respect to service life, it is in some cases done on the basis of information about pressure loss involved in the filters as in the seventh embodiment. However, when an amount of dust in the clean room is small, pressure may not rise to an end pressure loss but service life is in some cases determined on the basis of hours of use. In the twelfth embodiment, when the operating hours are integrated and are longer than a time period input as a judgement condition, a FFU or FFUs having completed the service life are made to blink integrated operating time in red. In the case where integrated operating time is used to judge the filter service life, the FFU operating time is used as a measure of how much dust has accumulated on an associated filter. In the invention, it is possible to acquire dust density in the clean room as information as well as the FFU operation time as in the tenth embodiment. Accordingly, by integrating dust density around a predetermined FFU on an operating time period, the filter service life can be determined based on a value close to the actual amount of dust accumulated in the filters.

The invention takes effect in further improving cleanliness in the clean room through controlling the direction and air volume of an air flow blown into the clean room in accordance with positional information and pressure information from the FFUs installed in the ceiling of the clean room and from the differential pressure gauges provided in the ceiling chamber.

Further, the invention takes effect in improving cleanliness in the clean room since the FFU control system can control the fans and dampers installed under the floor in accordance with the wind velocity information from the wind velocity gauges provided in the clean room.

Also, the invention takes excellent effect in convenience during use since the FFU control system displays on a control screen an air volume calculated after the fan motors are controlled with respect to revolution speed.

What is claimed is:

1. A clean room comprising:

a fan filter unit control system including fan filter units provided in a ceiling of the clean room and a control device for controlling the fan filter units; and differential pressure gauges provided in a ceiling chamber of the clean room, wherein revolution speeds of fan motors for the fan filter units are controlled in accordance with information about positions of the fan filter units and information about pressures detected by the differential pressure gauges, wherein air volumes are calculated and displayed after revolution speeds of the fan motors have been controlled.

2. A clean room according to claim 1, further comprising:

wind velocity gauges provided in the clean room; and underfloor fans provided under a floor of the clean room including underfloor dampers, wherein revolutions of the underfloor fans are controlled in accordance with information from the wind velocity gauges and wherein opening ratios of the underfloor dampers are controlled.

3. A clean room according to claim 1 further comprising:

wind velocity gauges provided in the clean room; and a grating floor of the clean room having an adjustable opening ratio, wherein the opening ratio of the grating floor is controlled in accordance with information from the wind velocity gauges.

* * * * *